US007026614B2

(12) United States Patent
Saitoh

(10) Patent No.: US 7,026,614 B2
(45) Date of Patent: Apr. 11, 2006

(54) AUTOMATIC METHODS FOR FOCUS AND ASTIGMATISM CORRECTIONS IN CHARGED-PARTICLE BEAM INSTRUMENT

(75) Inventor: Manabu Saitoh, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 10/916,007

(22) Filed: Aug. 11, 2004

(65) Prior Publication Data

US 2005/0035290 A1    Feb. 17, 2005

(51) Int. Cl.
*G01N 23/225* (2006.01)
*H01J 37/153* (2006.01)
*H01J 37/28* (2006.01)

(52) U.S. Cl. .................. 250/307; 250/310; 250/309; 250/398

(58) Field of Classification Search .................. None
See application file for complete search history.

(56) References Cited

U.S. PATENT DOCUMENTS

| 4,554,452 | A | * | 11/1985 | Suganuma | .................. 250/310 |
| 5,144,129 | A | * | 9/1992 | Kobayashi et al. | ......... 250/307 |
| 5,313,062 | A | | 5/1994 | Yamada | |
| 6,825,480 | B1 | * | 11/2004 | Watanabe et al. | ........... 250/310 |

* cited by examiner

*Primary Examiner*—Jack I. Berman
(74) *Attorney, Agent, or Firm*—The Webb Law Firm

(57) ABSTRACT

Automatic methods for focus and astigmatism corrections in a charged-particle beam instrument find an amount of excitation of the objective lens that provides the position of a circle of least confusion and can perform accurate automatic corrections of focus and astigmatism. The edge components of the original image along the X- and Y-directions are extracted separately, using respective filters. Noise reduction and normalization of numerical values are performed for each of the resulting two sets of data. Two-dimensional matrices of numerical values indicating the edge components in the X- and Y-directions, respectively, are found independently. The sums of the elements of the matrices are taken as focus evaluation values of the original image in the X- and Y-directions, respectively.

23 Claims, 9 Drawing Sheets

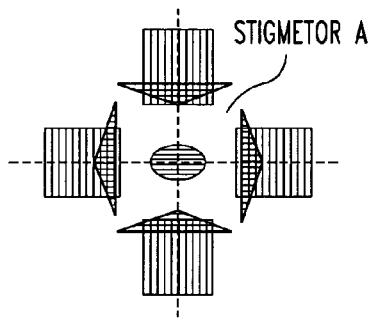 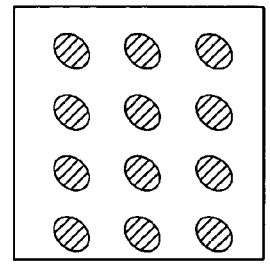 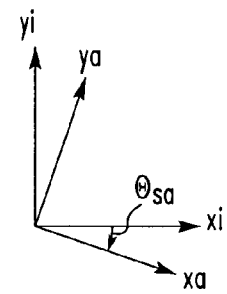
*FIG.10A*  *FIG.10B*  *FIG.10C*
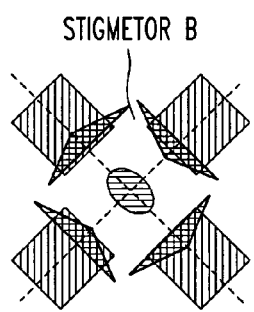 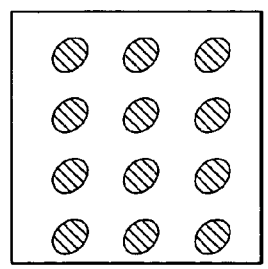 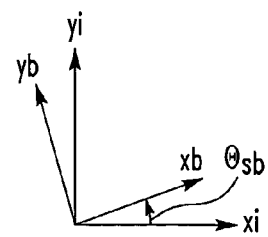
*FIG.11A*  *FIG.11B*  *FIG.11C*

AUTOMATIC METHODS FOR FOCUS AND ASTIGMATISM CORRECTIONS IN CHARGED-PARTICLE BEAM INSTRUMENT

BACKGROUND OF THE INVENTION

1. Field of the Invention

The present invention relates to automatic methods for focus and astigmatism corrections in a scanning charged-particle beam instrument, such as a scanning electron microscope, having functions of automatic focus correction and automatic astigmatic correction.

2. Description of Related Art

A scanning electron microscope, which is a typical example of scanning charged-particle beam instrument, is now described. In a scanning electron microscope, an electron beam produced from an electron gun is accelerated toward a specimen. The accelerated beam is sharply focused onto the specimen by a condenser lens and an objective lens. The beam is also scanned across a desired area on the specimen by deflection coils. The strength of the beam, i.e., the amount of beam current, is adjusted by the condenser lens and an objective lens aperture (baffle). In this microscope, secondary electrons produced by scanning the specimen with the electron beam are detected. The resulting signal is fed to a CRT in synchronism with the scanning of the primary electron beam. As a result, a scanned image of the specimen is displayed.

The scanning electron microscope constructed in this way has functions of automatic focus correction and automatic astigmatic correction to permit high-resolution imaging. The scanning electron microscope is now further described taking account of these functions. The electron beam from the electron gun is scanned back and forth by the upper and lower stages of deflection coils. In particular, the beam deflected by the upper stage of deflection coil is deflected in the reverse direction by the lower stage of deflection coil. The center point of the deflection of the beam is set close to the principal plane of the objective lens. Sawtooth-wave signals are supplied to the deflection coils from vertical and horizontal scanning signal-generating circuits, so that the beam scans over the specimen in two dimensions. In some cases, triangular-wave signals may be used as the signals for scanning.

As the electron beam is scanned over the specimen, secondary electrons, back-scattered electrons, X-rays, and so on are produced from the specimen. These particles and rays are detected by a detector having characteristics responsive to the kinds of the particles and rays. For example, secondary electrons from the specimen are detected by a secondary electron detector.

The output signal from the detector is stored as an XY two-dimensional image signal in or on an image storage means, such as an image memory or film, in synchronism with the vertical and horizontal scanning signals. The image signal is sent to an image processor, where the signal is processed to permit the observer's easy observation. Then, the data is stored in a control computer, which displays a scanned image of the two-dimensional scanned area of the specimen on the screen of the monitor according to the stored image data.

Also, where the height of the specimen surface varies according to the observation position, it is necessary to control the excitation current either of the objective lens or of an auxiliary focusing coil mounted close to the objective lens, in order to focus the beam onto the specimen surface accurately.

Furthermore, a stigmator coil for correcting astigmatism attributed to nonuniformity of the lens field is usually mounted above the objective lens. A sharp scanned image can be obtained by controlling the stigmator coil. The aforementioned lenses and coils are controlled by controlling the lens control power supply and coil control power supply under control of the control computer.

The instrument is so designed that the objective lens (or the auxiliary focusing coil) and the stigmator coil are controlled by the operator's operations on the control computer. The operator manipulates an encoder knob or the like such that the image becomes sharpest. To simplify the operations, a scanning charged-particle beam instrument, such as a scanning electron microscope, is generally equipped with an automatic control function using an electrical circuit or computer. This function is known as automatic focus and astigmatism correcting functions and described, for example, in U.S. Pat. No. 5,313,062.

The automatic focus correcting function is described while taking a scanning electron microscope as an example. Similar operations are performed also in other scanning ion beam instruments.

First, the amount of excitation B(t) of the objective lens or auxiliary focusing coil is varied in steps. At each value of the excitation, the electron beam is scanned over the specimen. Secondary electrons produced from the specimen by each scan are detected. The resulting signal is supplied to the image processor and passed through a high-pass filter to extract an evaluation value S(t) indicating the sharpness of the image, i.e., the degree of focusing. S(t) is herein referred to as the evaluation value of the focus.

The relation between the amount of excitation B(t) and the evaluation value S(t) is examined using an appropriate function, such as a Gaussian distribution function, until a fit is found. A position t=J where the evaluation value S(t) becomes equal to an extreme value S(J) is found. The J is not restricted to integers but found as a real number. FIG. 1(a) is a graph showing the relation between the amount of excitation B(t) and the evaluation value S(t). In this graph, the horizontal axis indicates the amount of excitation B(t) of the focusing coil or objective lens and the vertical axis indicates the evaluation value S(t) of the focus. FIG. 1(b) is a ray diagram showing the manner in which the beam diameter varies with varying the amount of excitation for focusing. Where automatic astigmatic correction is performed, the horizontal axis indicates the amount of excitation of the stigmator coil, while the vertical axis indicates the evaluation value of astigmatism.

The amount of excitation B(J) providing the relation t=J is fed back to the objective lens or auxiliary focusing coil, and then an image signal is gained. At this time, to speed up the operation, signals fed to the deflection coils may be thinned out. Alternatively, a geometrical figure may be drawn to treat the signal obtained by the detection as a one-dimensional signal.

Where the lens has astigmatism, if the automatic focus correcting function is energized, the relation between the amount of excitation B(t) of the lens and the focus evaluation value S(t) is given by FIG. 2(a). That is, two peaks, or upper and lower foci, appear. FIG. 2(b) is a ray diagram showing the amount of excitation for focusing in a case where the lens is free of astigmatism. FIG. 2(c) is a ray diagram showing the amount of excitation for focusing in a case (FIG. 2(a)) where the lens has astigmatism. As shown in FIG. 2(c), the cross sections of the charged-particle beam at the peak positions of the upper and lower foci are focused only in one direction; the cross sections are not focused at all in the other directions. That is, the charged-particle beam delineates a linear elliptical form.

For the sake of convenience, FIG. 2(c) shows a ray diagram in which the upper focus indicates a focused condition achieved in the X-direction and the lower focus indicates a focused condition achieved in the Y-direction. Of course, depending on the magnitude and direction of astigmatism, the upper and lower foci may be Y- and X-direction foci, respectively. The direction in which focusing is achieved may deviate from the X- and Y-directions by some angles.

Where the lens has astigmatism as described above, if the specimen surface is scanned with a charged-particle beam in the X- and Y-directions, and if an image signal is gained, the displayed image is seen to be sharper in a certain direction. This is a so-called line focus image.

In this case, the focal position should be set midway between the positions of the upper and lower foci. At this position, the cross section of the beam becomes a genuine circle, i.e., circle of least confusion. Therefore, this position is known as the position of the circle of least confusion. The cross section of the charged-particle beam in the specimen position is shaped into a minimum genuine circle by setting the amount of excitation of the objective lens or the amount of excitation of the focusing coil to an amount corresponding to the position of the circle of least confusion and then optimally adjusting the excitation of the stigmator coil. The image obtained by scanning the beam in this way is sharpest.

The automatic astigmatic correction function is next described. When this function is implemented, what is controlled is only the stigmator (stigmator coil). The operation is similar to the automatic focus correction function. This astigmatic correction function is described by referring to FIGS. 3(a)–3(d).

Referring to FIG. 3(a), showing the state assumed before astigmatism is corrected, it can be regarded that adjustment of the excitation of the stigmator coil varies the distance between the position Zm of the circle of least confusion and the position Zx of the X focal point or the distance between the position Zm of the circle of least confusion and the Y focal position Zy.

Generally, a quadrupole coil is used for astigmatic correction. If the excitation of the stigmator coil is adjusted, the focal position, Zx and Zy, moves in the Z-direction while the distance Dx (=Zm−Zx) between the X focal position Zx and the position Zm of the circle of least confusion and the distance Dy (=Zm−Zy) between the Y focal position Zy and the position Zm of the circle of least confusion maintain the relation Dx=Dy. FIG. 3(b) shows the manner in which the X and Y focal positions are moved away from the position of the circle of least confusion. FIG. 3(c) shows the manner in which the X and Y focal positions are moved toward the position of the circle of least confusion. In FIG. 3(b), the radius of the circle of least confusion increases. On the other hand, in FIG. 3(c), the radius decreases. As a result, it can be said that the corrective operation of the quadrupole correcting coil varies the radius of the circle of least confusion without moving its position.

When the amount of correction is increased from the state of FIG. 3(c) and the electron optics assumes the state shown in FIG. 3(d), the relation Dx=Dy=0 holds. That is, all of the X focal position, Y focal position, and position of the circle of least confusion agree. As a result, the radius of the circle of least confusion is minimized. The amount of excitation necessary for the stigmator coil at this time is an optimum amount of excitation.

In the series of operations described so far, the relation between the amount of excitation of the stigmator coil and the evaluation value of astigmatism is coincident with the S(t)-B(t) curve of FIG. 1(a). Therefore, the position at which the relation t=J holds corresponds to the optimum amount of excitation of the stigmator coil.

When the focal position is not coincident with the position of the circle of least confusion, if the excitation of the stigmator coil is adjusted, a focus in the X-direction is obtained when the relation Dz=Dx holds, where Dz is the distance between the present focal position and the position of the circle of least confusion. A focus in the Y-direction is obtained when the relation Dz=Dy holds. That is, a linear focused image appears twice when the excitation of the stigmator coil is adjusted. At this time, the relation between the amount of excitation of the stigmator coil and the evaluation value of astigmatism agrees with the S(t) versus B(t) curve of FIG. 2(a). That is, the midpoint between the amounts of excitation at which the two linear focused images appear respectively is the optimum amount of excitation of the stigmator coil.

As described so far, the sharpest image is obtained in principle by performing one automatic operation for correcting the focus and one automatic operation for correcting the astigmatism.

The conventional automatic method for focus correction described so far has at least seven drawbacks as described below.

First, where there is astigmatism, it has been difficult to determine the focus. That is, where there is astigmatism, if the focus correcting coil is operated, the two peaks at the upper and lower foci are summed up. Two peaks appear (double peak) on the focus evaluation value curve as shown in FIG. 2(a). In this case, the peaks are overlapped in a manner different depending on the amount of astigmatism. Therefore, as the upper and lower foci approach each other, it becomes more difficult to separate the two peaks apart.

The presence or absence of astigmatism is judged according to whether the curve indicating the evaluation value of the focus has a single or double peak. In the case of a double peak, the optimum amount of excitation is set at the center of the double peak. In the case of a single peak, the amount is set at the vertex of the peak. It is difficult, however, to make such a judgment. The vertex on one side of the double peak may be misregarded as the vertex of a single peak, leading to failure to find the optimum amount of excitation.

Second, it is difficult to make astigmatic correction under the state of focus deviation. Under this condition, if the stigmator coil is operated, a double peak consisting of superimposition of the two peaks at the upper and lower foci appears on the curve indicating the evaluation value of the focus. In this case, as the amount of the focus deviation increases, the double peaked curve widens more. As a result, it may be impossible to separate the two peaks. If the curve widens excessively, the detection itself of the peaks is made impossible. In consequence, astigmatic correction is quite difficult to achieve under the state of focus deviation.

Third, it is difficult to judge whether there is astigmatism or not. That is, as mentioned previously, it is difficult to judge whether there is astigmatism because it is difficult to separate the two peaks, especially when the amount of astigmatism is small.

Fourth, when the specimen has a pattern consisting of elements spaced apart from each other in one direction (e.g., a line and space pattern), it has been impossible to recognize that astigmatic correction cannot be done. In particular, where the elements of the specimen are arrayed in one direction, it is theoretically impossible to perform astigmatic correction. However, a clear peak appears on the curve indicating the evaluation amount of astigmatism. Although this peak might be on one side of a double peak, the single peak has been judged as giving an optimum value.

Fifth, the specimen for which the automatic function of astigmatic correction is used has needed to have uniform directionality and many features. That is, where there is astigmatism, the two peaks at the upper and lower foci are superimposed to thereby produce a double peak. The heights of the two peaks may differ depending on the feature of the specimen. This may lead to failure of the detection of the peaks.

For example, where the surface topography of the specimen has strong directionality in the X-direction, a steep peak appears at one of the upper and lower foci. A mild peak appears at the other. If two peaks are superimposed, only the steep peak is conspicuous. Therefore, the obtained amount of excitation is not an optimum value but an amount of excitation at the upper or lower focus. Hence, astigmatic correction has been done unsuccessfully.

Sixth, where the specimen is flat and has less features but has strong directionality like an LSI pattern, it is difficult to enhance the accuracy of automatic focus correction or astigmatic correction. For this reason, there is the danger that an incorrect optimum excitation position is detected. In the case of such a specimen, the image yields a small amount of features. The evaluation value of the focus has been buried in the image noise.

Seventh, where the specimen is flat and has less features but has strong directionality like an LSI pattern, the direction along which the evaluation value of focus is found does not agree with the direction of the pattern. Therefore, the curve obtained by plotting the focus evaluation value against the objective lens evaluation value becomes milder. The optimum amount of focus correction cannot be found accurately. Furthermore, the direction along which the astigmatism evaluation value is found does not agree with the direction of the pattern. The curve obtained by plotting the astigmatism evaluation amount against the stigmator coil excitation amount becomes milder. Consequently, the optimum amount of astigmatic correction cannot be found accurately.

SUMMARY OF THE INVENTION

It is an object of the present invention to provide automatic methods for focus and astigmatism corrections used in a charged-particle beam instrument, the methods being characterized in that they can find an amount of excitation of the objective lens corresponding to the focal position (i.e., the position of the circle of least confusion) of the image if astigmatism has not been corrected. The methods can also find an optimum amount of excitation of the stigmator coil if the image is not in focus. The methods permit automatic and accurate corrections of focus and astigmatism in cases where the specimen is flat and has a small amount of features, such as a semiconductor pattern.

An automatic method for focus correction in a charged-particle beam instrument in accordance with the present invention comprises the steps of: varying the strength of a lens that focuses the charged-particle beam onto a specimen in steps such that the state of the focus of the beam on the specimen is varied in steps; scanning a desired area on the specimen with the beam in each step of the focus; obtaining image data from a signal detected and obtained based on the scanning with the beam; processing the image data to find a focus evaluation value; finding a focal position from a relation between the strength of the lens and the focus evaluation value; and setting the strength of the lens that focuses the beam to a value corresponding to the focal position. When the image data is processed to find the focus evaluation value, data about one frame of image is processed to find the degree of focus (related to beam width) in each of arbitrary first and second directions that are independent of each other. The lens strength is found at each of the focal positions in the first and second directions according to the focus evaluation amount found in each step of the focus. The strength of the lens, which focuses the beam, is set, using the midpoint of the two focal positions as an overall focal position.

In this automatic method for focus correction according to the present invention, the upper and lower foci are detected separately. Therefore, if there is astigmatism, the automatic function of focus correction can be implemented normally.

An automatic method for astigmatic correction in accordance with the present invention comprises the steps of: varying the strength of a stigmator in steps; scanning a desired area on the specimen with a beam at each value of the strength of the stigmator; obtaining image data from a signal detected and obtained based on the scanning with the beam; processing the image data to find an astigmatism evaluation value; finding an optimum position for astigmatic correction from a relation between the strength of the stigmator and the astigmatism evaluation value; and setting the strength of the stigmator to a value corresponding to the optimum position for astigmatic correction. When the image data is processed to find the astigmatism evaluation value, data about one frame of image is processed in each of arbitrary first and second directions that are independent of each other. Strengths of the stigmator that give optimum positions for astigmatic correction in the first and second directions, respectively, are found according to the astigmatism evaluation value found at each value of the strength of the stigmator. The strength of the stigmator is set, using the midpoint of the two optimum positions as an overall optimum position for astigmatic correction.

In this automatic method for astigmatic correction according to the present invention, the upper and lower foci are detected separately. Therefore, if the focal point has shifted, the automatic function of astigmatic correction can be implemented normally.

An automatic method for focus and astigmatism corrections in accordance with the present invention performs an automatic focus correcting operation at least once and an automatic astigmatism correcting operation at least once to make focus correction and astigmatic correction simultaneously. The automatic focus correcting operation consists of processing image data about one frame of image in each of arbitrary first and second directions that are independent of each other when the image data is processed to find a focus evaluation value, finding lens strengths giving focal positions in the first and second directions, respectively, according to the focus evaluation value found in each step of the focus, and setting the strength of the lens, which focuses the beam, using the midpoint of the two focal positions as an overall focal position. The automatic astigmatic correcting operation consists of processing image data about one frame of image in each of arbitrary first and second directions that are independent of each other when an astigmatism evaluation value is found by processing the image data, finding stigmator strengths giving optimum astigmatic correction positions in the first and second directions, respectively, according to the astigmatism evaluation value found at each value of the strength of the stigmator, and setting the strength of the stigmator using the midpoint of the two optimum astigmatic correction positions as an overall optimum astigmatic correction position.

In this automatic method for focus and astigmatism corrections according to the present invention, the automatic focus correcting operation and automatic astigmatism correcting operation are each carried out at least once. The operations may be carried out repetitively. Consequently, an image in which the focus and astigmatism have been completely corrected is obtained.

Other objects and features of the present invention will appear in the course of the description thereof, which follows.

BRIEF DESCRIPTION OF THE DRAWINGS

FIGS. 10(a), 10(b), and 10(c) are diagrams showing the direction of action of a stigmator; and FIGS. 11(a), 11(b), and 11(c) are diagrams showing the direction of action of another stigmator.

DESCRIPTION OF THE PREFERRED EMBODIMENTS

Figure 1A:
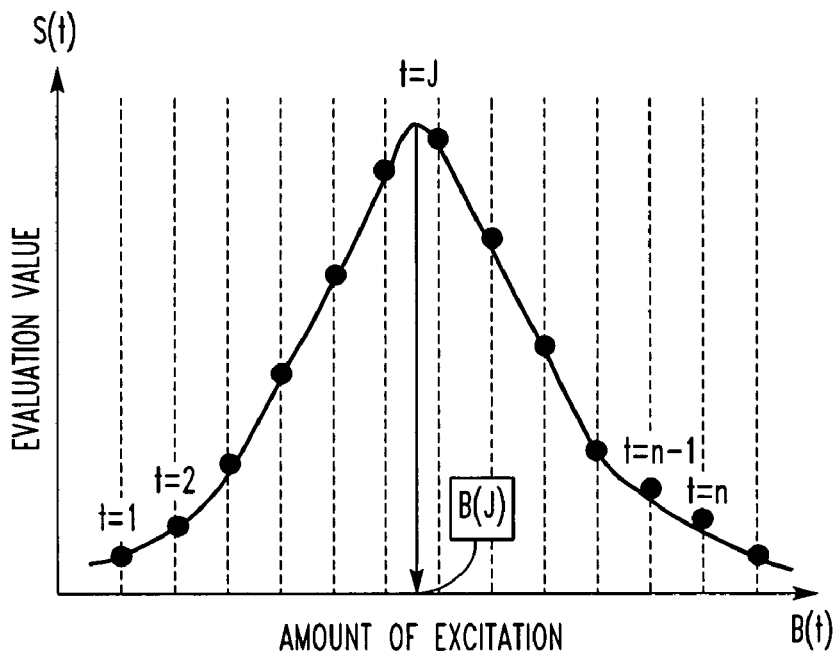
FIGS. 1(a) and 1(b) are diagrams illustrating an automatic focus correcting function.
Figure 1B:
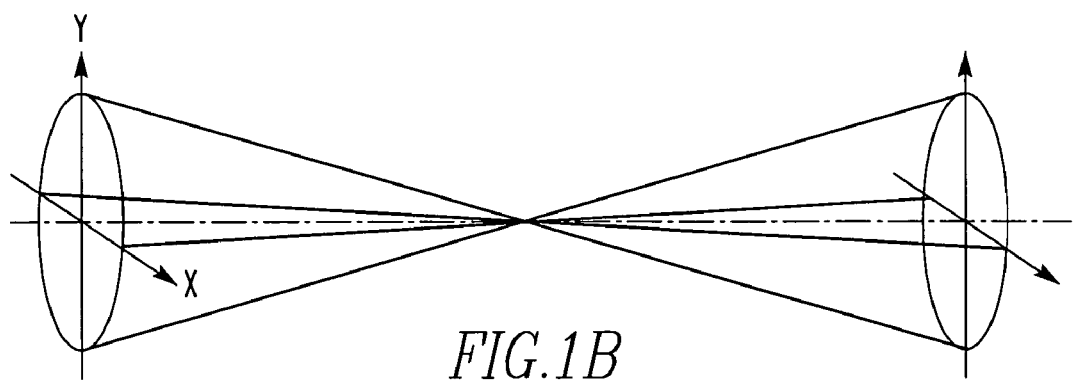
Figure 2A:
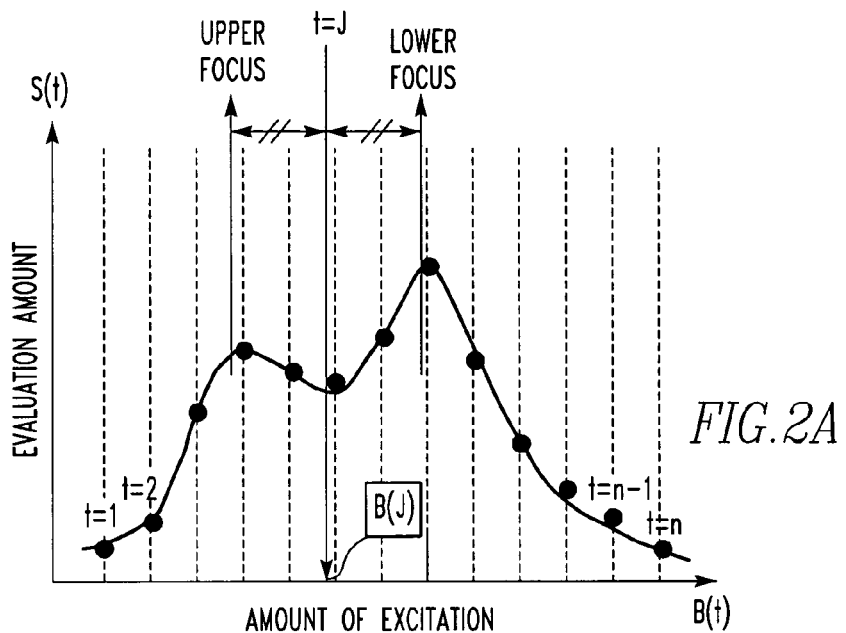
FIGS. 2(a), 2(b), and 2(c) are diagrams illustrating the automatic focusing correcting function in a case where there is astigmatism.
Figure 2B:
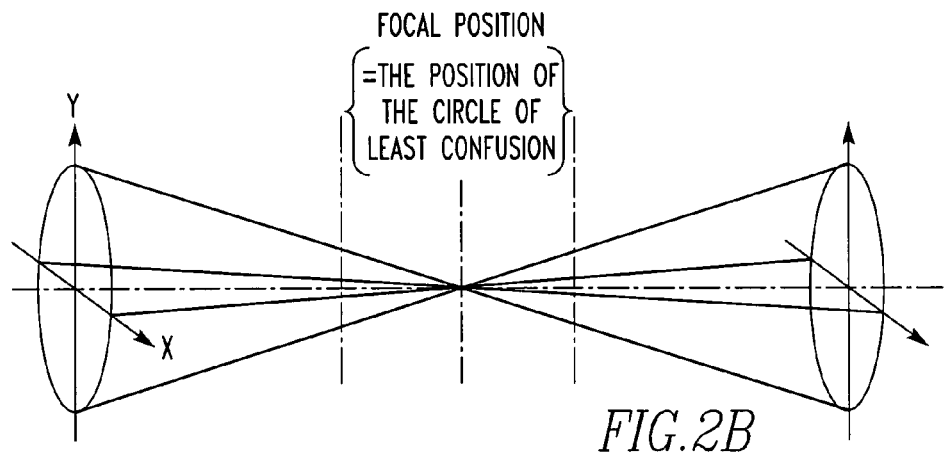
Figure 2C:
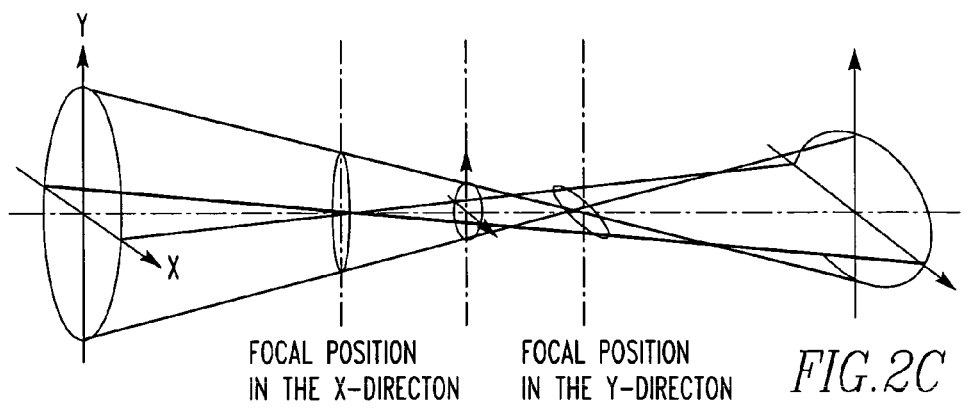
Figure 3A:
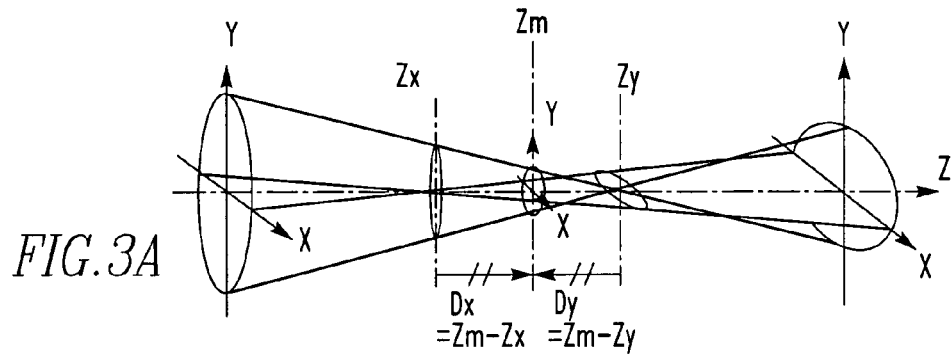
FIGS. 3(a), 3(b), 3(c), and 3(d) are diagrams illustrating the principle of astigmatic correction.
Figure 3B:
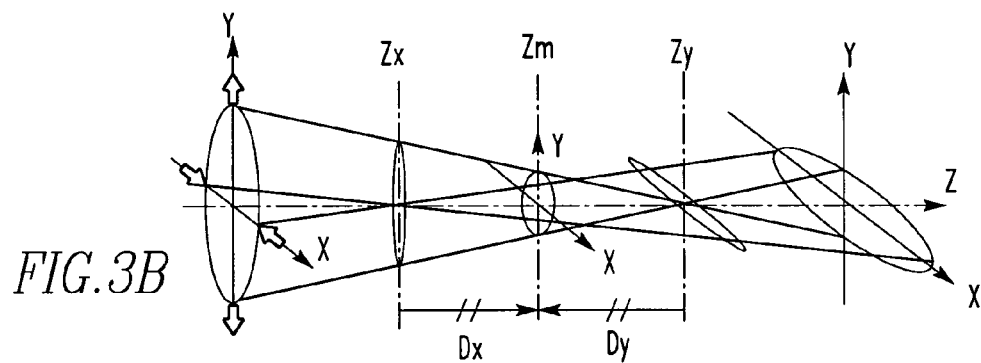
Figure 3C:
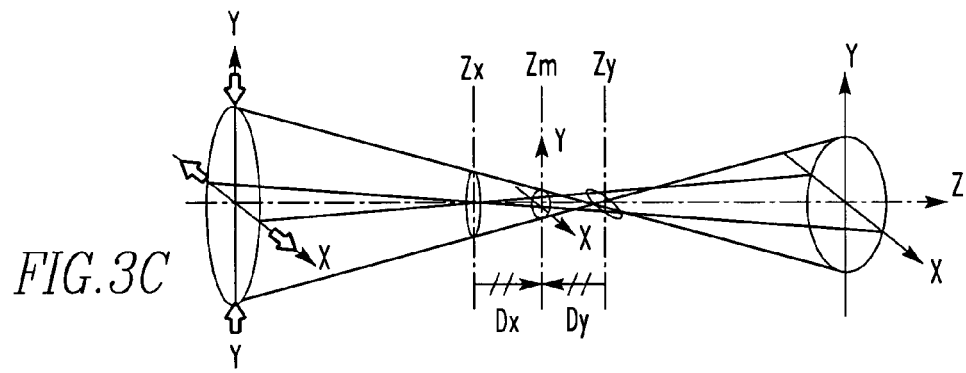
Figure 3D:
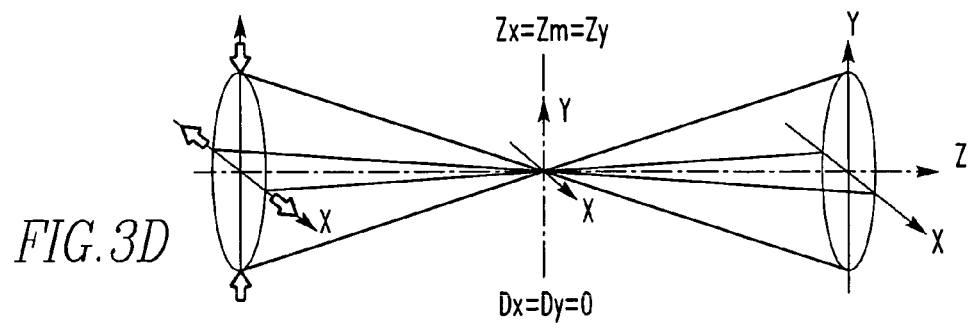
Figure 4:
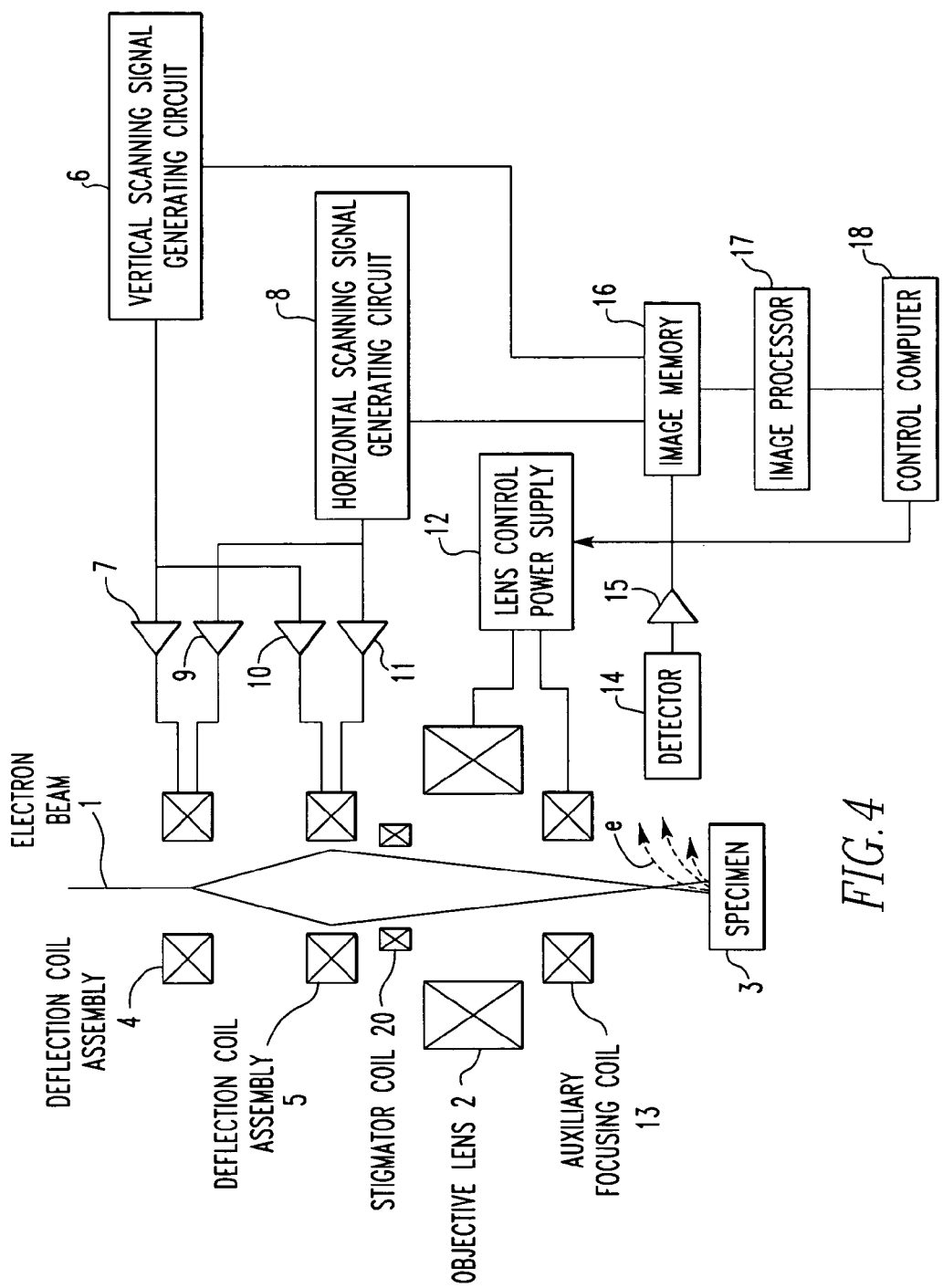
FIG. 4 is a block diagram of a scanning electron microscope for carrying out methods of automatically correcting focus and astigmatism in accordance with the present invention.

The preferred embodiments of the present invention are hereinafter described in detail with reference to the accompanying drawings. FIG. 4 shows a scanning electron microscope for implementing the present invention.

The microscope has an electron gun (not shown) emitting an electron beam 1. The beam 1 is sharply focused onto a specimen 3 to be observed, using a condenser lens (not shown) and an objective lens 2. The strength of the electron beam 1, or beam current, is adjusted by the condenser lens (not shown) and an objective lens aperture.

After the strength of the electron beam 1 has been adjusted, the beam is scanned in two dimensions over the specimen 3 by two stages of deflection coil assemblies 4 and 5. Each of the upper-stage deflection coil assembly 4 and lower-stage deflection coil assembly 5 has horizontal and vertical deflection coils. A vertical scanning signal is supplied to the vertical deflection coil of the upper-stage deflection coil assembly 4 from a vertical scanning signal generating circuit 6 via an amplifier 7. A horizontal scanning signal is supplied to the horizontal deflection coil of the upper-stage deflection coil assembly 4 from a horizontal scanning signal generating circuit 8 via an amplifier 9. A vertical scanning signal is supplied to the vertical deflection coil of the lower-stage deflection coil assembly 5 from the vertical scanning signal generating circuit 6 via an amplifier 10. A horizontal scanning signal is supplied to the horizontal deflection coil of the lower-stage of deflection coil assembly 5 from the horizontal scanning signal generating circuit 8 via an amplifier 11.

The electron beam 1 deflected by the two stages of deflection coil assemblies 4 and 5 is sharply focused by the objective lens 2 and directed at the specimen 3. The objective lens 2 is supplied with an excitation current from a lens control power supply 12. An auxiliary focusing coil 13 is positioned close to the objective lens 2. The auxiliary focusing coil 13 is also supplied with an excitation current from the lens control power supply 12. Usually, a coreless coil is used as the auxiliary focusing coil 13 to increase the response speed.

The electron beam 1 is sharply focused by the objective lens 2 or by both objective lens 2 and auxiliary focusing coil 13 and directed at the specimen 3 to be observed. As a result, secondary electrons, backscattered electrons, X-rays, and so on are produced due to interaction between the beam focused on the specimen and the specimen. In the present embodiment, secondary electrons e from the specimen 3 are detected by a secondary electron detector 14, for example. The backscattered electrons may be detected using a detector that detects backscattered electrons.

The output signal from the detector is amplified by an amplifier 15 and then stored as two-dimensional image data in an image memory 16 in synchronism with the vertical scanning signal from the vertical scanning signal generating circuit 6 and the horizontal scanning signal from the horizontal scanning signal generating circuit 8. The image data is sent to an image processor 17, where the data is processed to permit the observer's easy observation. Then, the data is sent to a control computer 18, which displays a scanned image of the specimen on the viewing screen of a monitor (not shown) according to the image data.

Also, where the height of the specimen surface varies according to the observation position, it is necessary to control the excitation current either of the objective lens 2 or of the auxiliary focusing coil 13 mounted close to the objective lens 2, in order to focus the electron beam 1 onto the specimen surface accurately.

Furthermore, a stigmator coil 20 for correcting astigmatism attributed to nonuniformity of the lens field is usually mounted above the objective lens 2. A sharp scanned image can be obtained by controlling the stigmator coil 20. The aforementioned lenses and coils are controlled by controlling the lens control power supply 12 and a stigmator coil control power supply (not shown) under control of the control computer 18.

In the present embodiment, the objective lens 2 (or auxiliary focusing coil 13) and the stigmator coil are automatically controlled by various components that are under control of the control computer 18. The operation of the structure described so far is described below. First, the operation of the automatic operation for focus correction is described.

The electron beam 1 is sharply focused onto the specimen 3 by the condenser lens (not shown) and objective lens 2 or auxiliary focusing coil 13. The beam 1 is made to scan a desired area on the specimen 3 by the two stages of deflection coil assemblies 4 and 5.

Secondary electrons e produced from the desired area on the specimen 3 in response to the scanning with the electron beam are detected by the secondary electron detector 14. The output signal from the detector 14 is amplified by the amplifier 15 and then stored as two-dimensional image data in the image memory 16 in synchronism with the vertical scanning signal from the vertical scanning signal generating circuit 6 and the horizontal scanning signal from the horizontal scanning signal generating circuit 8.

At this time, whenever two-dimensional image data corresponding to one frame of image, for example, is obtained, the amount of excitation of the objective lens 2 or auxiliary focusing coil 13 is varied in steps by instructions from the control computer 18. This is achieved by control over the lens control power supply 12 provided by the computer 18. Image data obtained at each value of the excitation is stored in the image memory 16. The image data stored in the image memory 16 is routed frame by frame to the image processor 17.

The image processor 17 performs a calculation for obtaining a focus evaluation value along each of two certain directions on the viewing screen. The processing is described with reference to the flowchart of FIG. 5.

Figure 5:
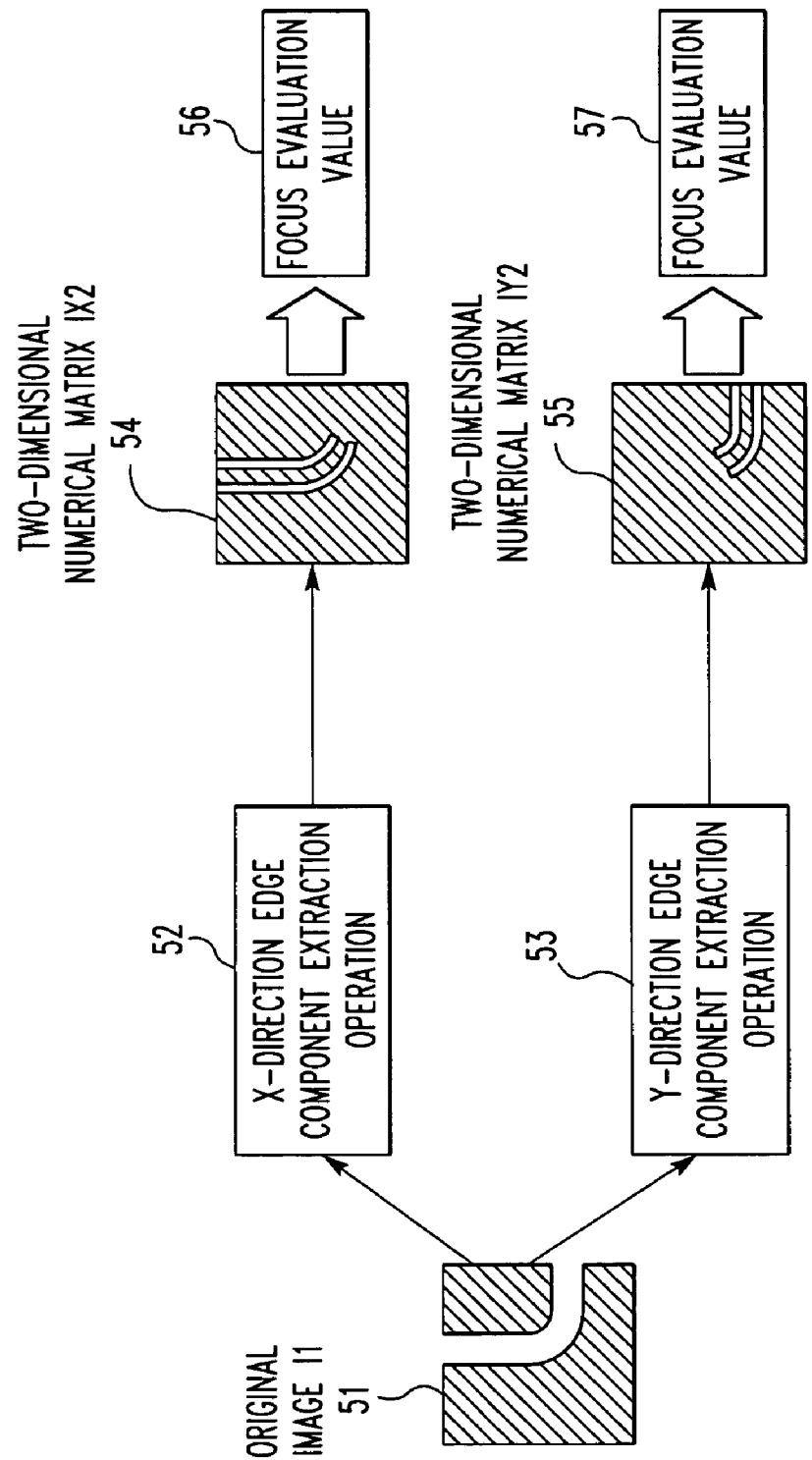
FIG. 5 is a diagram illustrating a method of calculating focus evaluation values in the X- and Y-directions.

Referring to FIG. 5, edge component extraction is performed on the original image 51 routed from the image memory 16 according to the topography of the specimen, using two one-dimensional edge extraction filters which detect edge components in two independent directions, respectively.

In the processing flow shown in FIG. 5, one of the two prepared filters detects only edge components parallel to the X-direction. The other filter detects only edge components parallel to the Y-direction. An X-direction edge component extraction operation 52 and a Y-direction edge component extraction operation 53 using these filters, respectively, are performed independently on the original image 51. The original image 51 is indicated by I1 in the figure.

When each of the edge component extraction operations 52 and 53 is performed, noise reduction and normalization of numerical values are carried out to independently find a two-dimensional numerical matrix 54 indicating the X-direction edge components and a two-dimensional numerical matrix 55 indicating the Y-direction edge components. These matrices 54 and 55 are indicated by IX2 and IY2, respectively, in the figure.

The sum of the elements of each of the found matrices IX2 and IY2 is found. The sums are focus evaluation values 56 and 57 of the original image I1 in the X- and Y-directions, respectively.

The two-dimensional numerical matrices IX2 and IY2 are found for each image data about one frame of image obtained by varying the amount of excitation of the objective lens 2 or auxiliary focusing coil 13 in steps. Accordingly, the focus evaluation values in the X- and Y-directions, respectively, are calculated at each value of the excitation.

In this way, the image processor 17 finds the focus evaluation values in the X- and Y-directions at each amount of the excitation. The found focus evaluation values are routed to the control computer 18.

Figure 6:
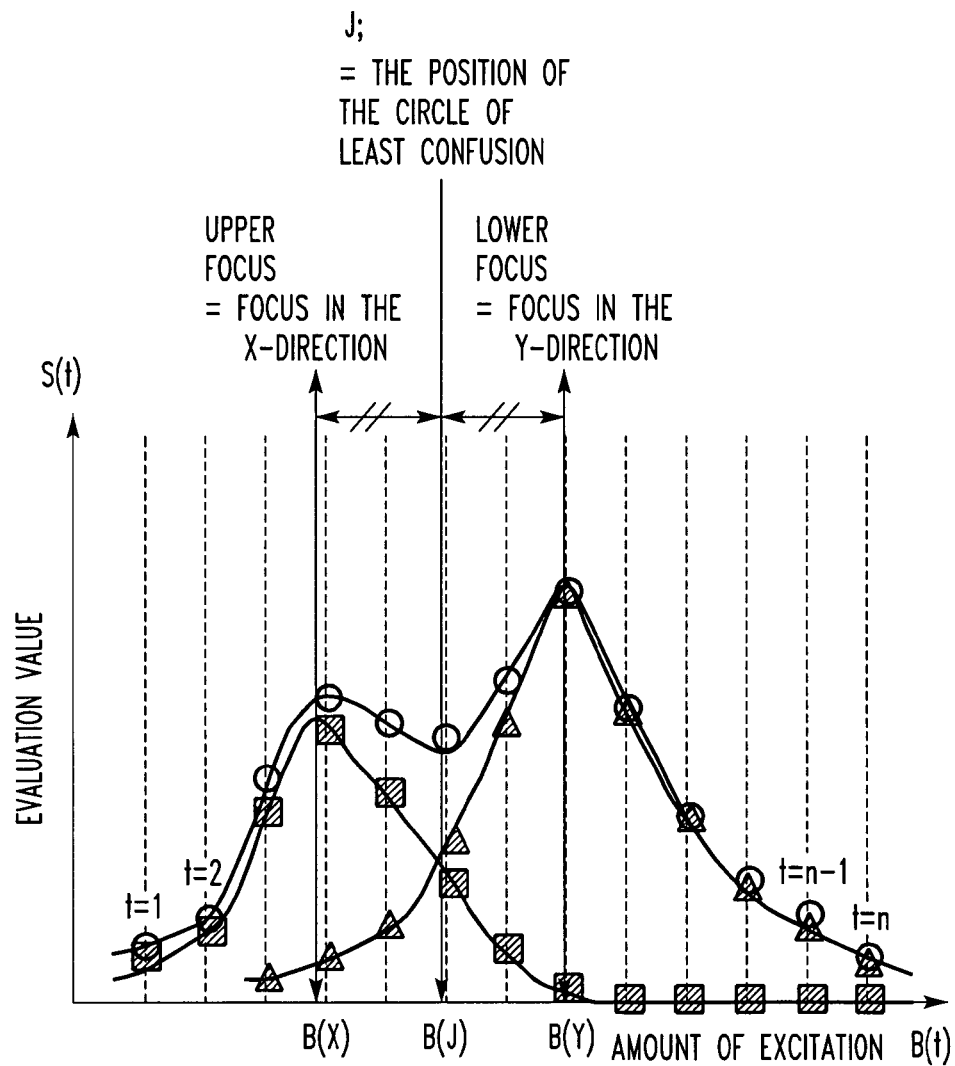
FIG. 6 is a graph in which the focus evaluation values are plotted against the amount of excitation of a lens in a case where the focus evaluation value is evaluated in the X- and Y-directions independently.

The control computer 18 plots the focus evaluation values in the X- and Y-directions for each value of the excitation as shown in FIG. 6. The computer 18 calculates the correlation between the amount of excitation of the objective lens 2 or auxiliary focusing coil 13 and the focus evaluation values of the image at each value of the excitation, and computes the most appropriate amounts of lens excitations B(X) and B(Y) for the X- and Y-directions, respectively.

The most appropriate amounts of lens excitations B(X) and B(Y) are identical provided that there is no astigmatism. They differ where there is astigmatism. Accordingly, where there is astigmatism, the midpoint B(J) between the amount of excitation B(X) of the objective lens 2 or auxiliary focusing coil 13 at which the X-direction focus evaluation value assumes a peak value and the amount of excitation B(Y) of the objective lens 2 or auxiliary focusing coil 13 at which the Y-direction focus evaluation value assumes a peak value is taken as the most appropriate amount of excitation. That is, $$B(J) = \frac{B(X) + B(Y)}{2}$$

The control computer 18 controls the lens control power supply 12 based on the most appropriate amount of excitation found in this way. As a result, the objective lens 2 or auxiliary focusing coil produces an excitation current providing the most appropriate amount of excitation.

In FIG. 6, the curve plotted using small circles has been obtained by accumulating frames of image indicated by the output signal from the detector obtained by the prior art two-dimensional scanning of a specimen.

Where the automatic focus correction is made on an area where a pattern having features only in one direction, such as a line and space pattern, exists, a peak appears only at one of the amounts of excitation B(X) and B(Y). In this case, the position of the single peak is taken as a focal position and fed back to the objective lens or auxiliary focusing coil. Alternatively, it may be judged that an error in operation has occurred. In this case, an error message may be displayed to move the specimen into another pattern position and then to perform the automatic operation for focus correction.

The operation of the automatic astigmatic correction is now described. In comparing the automatic operation for astigmatic correction and the automatic operation for focus correction, both operations are performed similarly except that they differ in controlled coil or lens. That is, in the case of the automatic focus correction, the objective lens 2 or auxiliary focusing coil 13 is controlled. In the case of the automatic astigmatic correction, the stigmator coil 20 is controlled.

Secondary electrons e produced from the specimen 3 in response to scanning with the electron beam are detected by the secondary electron detector 14. The output signal from the detector 14 indicative of the secondary electrons is amplified by the amplifier 15 and then stored as two-dimensional image data into the image memory 16 in synchronism with the vertical scanning signal from the vertical scanning signal generating circuit 6 and the horizontal scanning signal from the horizontal scanning signal generating circuit 8.

At this time, the amount of excitation of the stigmator coil 20 is varied in steps under instructions from the control computer 18 whenever two-dimensional image data about one frame of image is gained, for example. For this purpose, the computer 18 controls the stigmator coil power supply (not shown). Image data obtained at each value of the excitation is stored in the image memory 16. The image data stored in the image memory 16 is routed frame by frame to the image processor 17.

The image processor 17 calculates the astigmatism evaluation amount along each of the two certain directions on the viewing screen. This processing is performed in the same way as the automatic focus correcting operation already described in connection with FIG. 5.

In FIG. 5, the edge components are extracted from the original image 51 routed from the image memory 16, using one-dimensional edge extraction filters acting to detect edge components in mutually independent directions. The original image is indicated by I1.

In the processing flow shown in FIG. 5, one of the two prepared filters acts to detect edge components parallel to the X-direction on the viewing screen. The other filter detects edge components parallel to the Y-direction. An X-direction edge component extraction operation 52 and a Y-direction edge component extraction operation 53 using these filters, respectively, are performed independently.

When each of the edge component extraction operations 52 and 53 is performed, noise reduction and normalization of numerical values are carried out to independently find a two-dimensional numerical matrix 54 indicating the X-direction edge components and a two-dimensional numerical matrix 55 indicating the Y-direction edge components. These matrices 54 and 55 are indicated by IX2 and IY2, respectively, in the figure.

The sum of the elements of each of the found matrices IX2 and IY2 is found. The sums are astigmatism evaluation values 56 and 57 of the original image I1 in the X- and Y-directions, respectively.

The two-dimensional numerical matrices IX2 and IY2 are found for each set of image data about one frame of image obtained by varying the amount of excitation of the stigmator coil 20 in steps. Accordingly, the astigmatism evaluation values in the X- and Y-directions, respectively, are calculated at each amount of the excitation.

In this way, the image processor 17 finds the astigmatism evaluation values. The found astigmatism evaluation values are routed to the control computer 18, which in turn plots the astigmatism evaluation values at each amount of the excitation in the X- and Y-directions separately in the same way as in FIG. 6 where the focus evaluation value is plotted against the amount of lens excitation.

The computer 18 calculates the correlation between the amount of excitation of the stigmator coil 20 and the astigmatism evaluation value of the image at each value of the excitation, and finds the most appropriate amounts of stigmator coil excitations B(X) and B(Y) in the X- and Y-directions, respectively.

In principle, the most appropriate values of stigmator coil excitations B(X) and B(Y) are identical if the electron beam is not out of focus. They are different if the beam is out of focus. Accordingly, where the beam is out of focus, the midpoint B(J) between the amount of excitation B(X) of the stigmator coil 20 at which the X-direction astigmatism evaluation value assumes a peak value and the amount of excitation B(Y) of the coil 20 at which the Y-direction astigmatism evaluation value assumes a peak value is taken as the most appropriate amount of excitation of the stigmator coil.

The control computer 18 controls the stigmator coil power supply (not shown) according to the most appropriate amount of stigmator coil excitation found in this way. As a result, the stigmator coil 20 produces an excitation current resulting in the most appropriate amount of excitation.

A case where the automatic corrections of focus and astigmatism are made using a specimen that is flat is now described. The specimen has a less amount of features but has a pattern with strong directionality, such as an LSI pattern.

Also, in this case, the electron beam is scanned in two dimensions over the specimen 3 by the two stages of deflection coil assemblies 4 and 5. Secondary electrons e produced from the specimen 3 in response to the scanning are detected by the secondary electron detector 14. The output signal from the detector is stored as two-dimensional image data into the image memory 16 in synchronism with the vertical and horizontal scanning signals.

At this time, the amount of excitation of the objective lens 2 or auxiliary focusing coil 13 is varied in steps under instructions from the control computer 18 whenever two-dimensional image data about one frame of image is gained. Image data about each amount of the excitation is stored in the image memory 16. The image data stored in the image memory 16 is routed frame by frame to the image processor 17.

Figure 7:
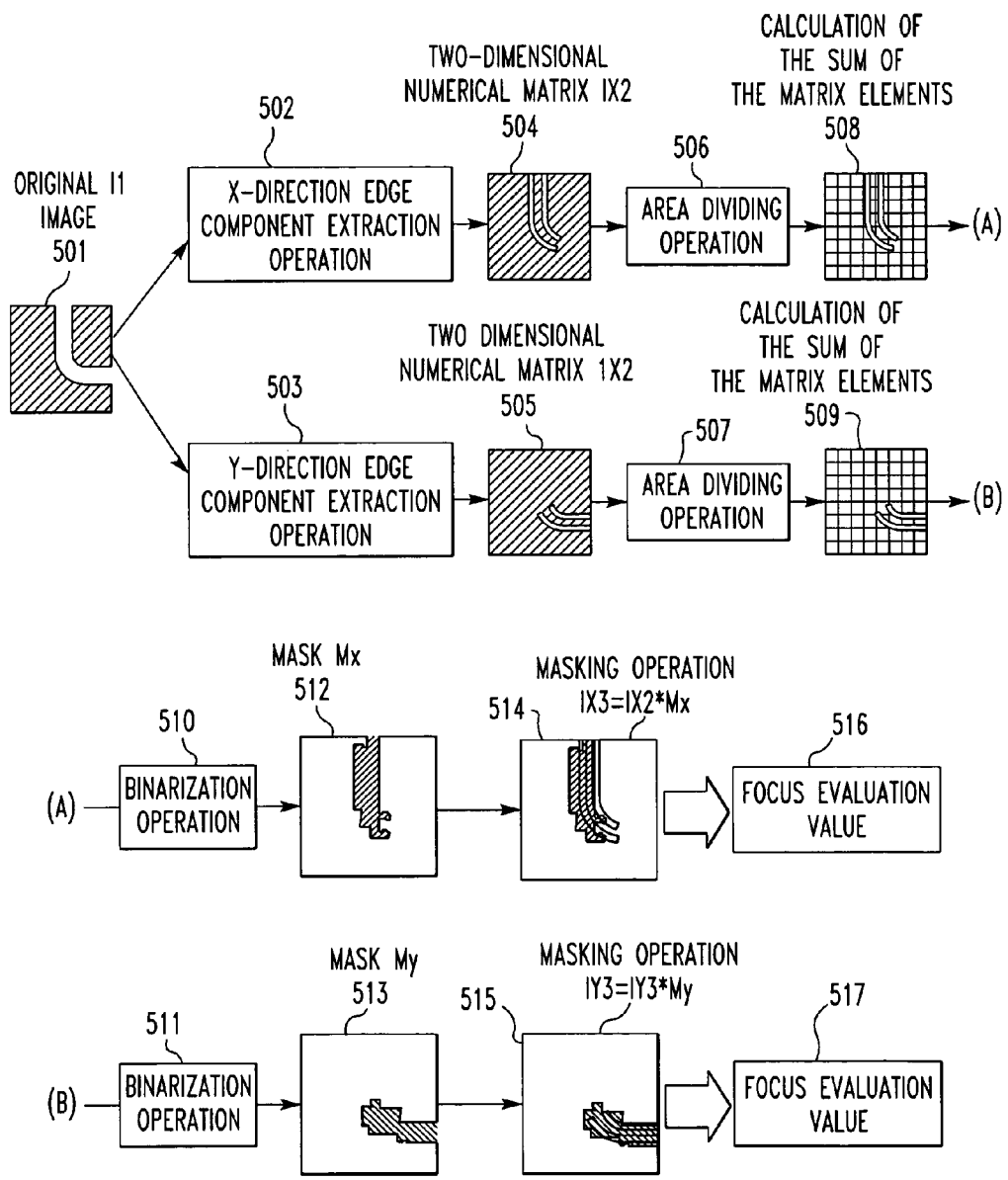
FIG. 7 is a diagram illustrating methods of calculating the X-direction focus evaluation value and Y-direction focus evaluation value, respectively.

The image processor 17 calculates the focus evaluation value in the procedure described below. The processor 17 computes the focus evaluation value along each of the X- and Y-directions on the viewing screen. The flow of this computational processing is illustrated in FIG. 7.

The edge components of the original image 501 are extracted using an edge extraction filter, such as a one-dimensional Sobel filter with a unit of 3×3 or 5×5 pixels, for example, or Laplacian filter. The original image is indicated by I1.

At this time, two filters each having an independent directionality are prepared by making use of the directionalities of one-dimensional filters. In this embodiment, one of the two filters detects edge components in the X-direction, while the other detects edge components in the Y-direction. An X-direction edge component extraction operation 502 and a Y-direction edge component extraction operation 503 using these filters, respectively, are performed separately. When each operation is performed, noise reduction and normalization of numerical values are carried out to independently find a two-dimensional numerical matrix 504 indicating the X-direction edge components and a two-dimensional numerical matrix 505 indicating the Y-direction edge components. These matrices 504 and 505 are also indicated by IX2 and IY2, respectively.

Area dividing operations 506 and 507 are performed for the matrices IX2 and IY2, respectively, to form regions. The sum of the matrix elements in each region is calculated.

A threshold value has been previously obtained experimentally. Binarization operations 510 and 511 are performed on the sum of individual regions, using the threshold value. In particular, each region is set to either 0 or 1. As a result, region masks 512 and 513 are created. The masks 512 and 513 are also indicated by Mx and My, respectively.

Then, masking operations 514 and 515 are performed. That is, the original numerical matrices IX2, IY2 are multiplied by the masks Mx and My. The matrices masked in this way are indicated by IX3 and IY3, respectively.

Then, the sum of the elements of each of the matrices IX3 and IY3 is found. The sums are focus evaluation values 516 and 517, respectively, of the original image I1 in the X- and Y-directions, respectively.

The two-dimensional numerical matrices IX2 and IY2 are found whenever image data about one field of image is obtained by varying the amount of excitation of the objective lens 2 or auxiliary focusing coil 13 in steps. Therefore, the focus evaluation values in the X- and Y-directions are calculated at each value of the excitation.

Then, the focus evaluation values calculated at each amount of the excitation are sent in turn to the control computer 18. As shown in FIG. 6, the focus evaluation values taken in the X- and Y-directions, respectively, are separately plotted against the amount of excitation.

The control computer 18 calculates the correlation between the amount of excitation of the objective lens 2 or auxiliary focusing coil 13 and the focus evaluation value of the image at each of the excitation and finds the most appropriate excitation amounts B(X) and B(Y) of the lens or coil along the X- and Y-directions, respectively.

Where there is no astigmatism, the excitation amounts B(X) and B(Y) are identical. On the other hand, where there is astigmatism, they are different. Where there is astigmatism, the midpoint B(J) between the amount of excitation B(X) at which the X-direction focus evaluation amount assumes a peak value and the amount of excitation B(Y) at which the Y-direction focus evaluation amount assumes a peak value is taken as the most appropriate amount of excitation of the lens or coil.

The masks Mx and My are not always required to be found regarding each individual frame of image. If the first image obtained at the beginning of the automatic processing of focus correction has been focused to some extent, one set of masks Mx and My may be created from the image. The same masks may be applied to all images. Alternatively, n sets of masks may be created from all the images. N curves may be found by plotting the focus evaluation value against the lens excitation amount. The effects of the masking can be maximized by finding the optimum amount of lens excitation for focus correction from the curve having the steepest peak.

Figure 8:
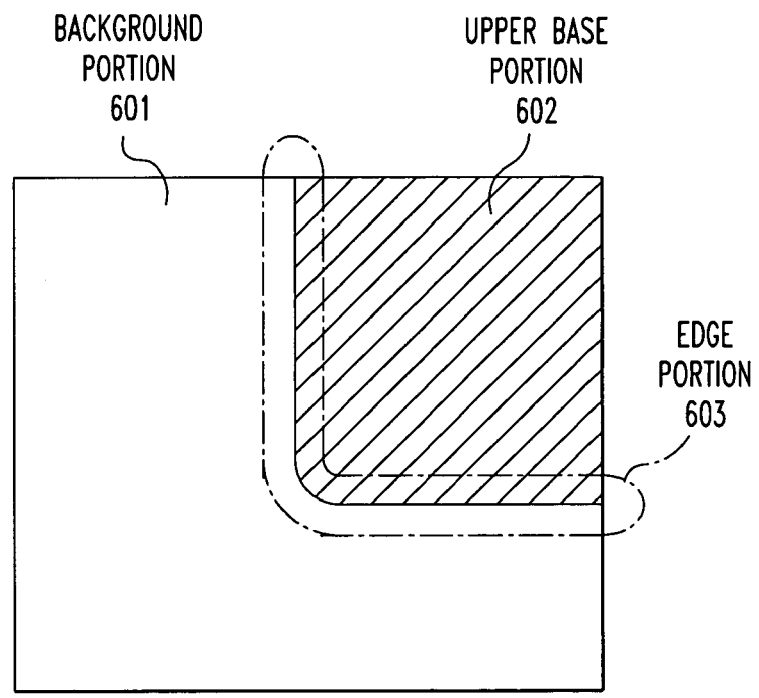
FIG. 8 is a diagram illustrating a method of reducing noise in an image of a semiconductor pattern.

The operations described so far are effective for a specimen that is flat and has a small number of features but has a pattern with strong directionality, such as an LSI pattern. For example, in the case of the image of pattern as shown in FIG. 8, the pattern is divided into an edge portion 603 having a high spatial frequency, a background portion 601 having a low spatial frequency, and an upper base portion 602. Generally, an image obtained by a charged-particle beam instrument, such as a scanning electron microscope, has a large amount of noise component. Therefore, during calculation of the focus evaluation amount, the noise component should be reduced as much as possible. Evaluation of the focus is equivalent to evaluating how sharp is the region having a high spatial frequency and so the region having a low spatial frequency is not associated with focus evaluation at all.

Consequently, noise in the focus evaluation amount can be reduced effectively by masking the background portion 601 and upper base portion 602 of the pattern with the region masks Mx and My. Especially, as the magnification of the image increases, the ratio of the background portion having a low spatial frequency and upper base portion to the whole image increases. Hence, the masking procedure becomes more effective with increasing the magnification.

The automatic operation for astigmatic correction is now described. This automatic operation is similar to the automatic operation for focus correction except that the controlled coil is the stigmator coil 20. The image processor 17 calculates the focus evaluation value in the procedure described below.

Secondary electrons e produced from the specimen 3 in response to scanning with the electron beam are detected by the secondary electron detector 14. The output signal from the detector 14 indicative of the secondary electrons is amplified by the amplifier 15 and then stored as two-dimensional image data into the image memory 16 in synchronism with the vertical scanning signal from the vertical scanning signal generating circuit 6 and the horizontal scanning signal from the horizontal scanning signal generating circuit 8.

At this time, the amount of excitation of the stigmator coil 20 is varied in steps under instructions from the control computer 18 whenever two-dimensional image data about one frame of image is gained, for example. For this purpose, the computer 18 controls the stigmator coil power supply (not shown). Image data obtained at each value of the excitation is stored in the image memory 16. The image data stored in the image memory 16 is routed frame by frame to the image processor 17.

The image processor 17 calculates the astigmatism evaluation amount along each of the X- and Y-directions on the viewing screen by a method similar to the method of calculation of the focus evaluation value already described in connection with FIG. 7. That is, a two-dimensional numerical matrix 504 indicating the X-direction edge components and a two-dimensional numerical matrix 505 indicating the Y-direction edge components are independently found by executing the computational processing flow of FIG. 7. These matrices 504 and 505 are also indicated by IX2 and IY2, respectively.

Area dividing operations 506 and 507 are performed for the matrices IX2 and IY2, respectively, to form regions. The sum of the matrix elements in each region is calculated. A threshold value has been previously obtained experimentally. Binarization operations 510 and 511 are performed on the sum of each region, using the threshold value. In particular, each region is set to either 0 or 1. As a result, region masks 512 and 513 are created. The masks 512 and 513 are also indicated by Mx and My, respectively.

Then, masking operations are performed. That is, the original numerical matrices IX2, IY2 are multiplied by the masks Mx and My. The matrices masked in this way are indicated by IX3 and IY3, respectively.

Then, the sum of the elements of each of the matrices IX3 and IY3 is found. The sums are astigmatism evaluation values, respectively, of the original image I1 in the X- and Y-directions, respectively.

The two-dimensional numerical matrices IX2 and IY2 are found whenever image data about one frame of image is obtained by varying the amount of excitation of the stigmator coil 20 in steps. Therefore, the focus evaluation values in the X- and Y-directions are calculated at each amount of the excitation.

Then, the astigmatism evaluation values calculated at each amount of the excitation are sent in turn to the control computer 18. The astigmatism evaluation values taken in the X- and Y-directions are separately plotted against the amount of excitation in the same way as the focus evaluation value shown in FIG. 6.

The control computer 18 calculates the correlation between the amount of excitation of the stigmator coil 20 and the astigmatism evaluation value of the image at each amount of the excitation and finds the most appropriate excitation amounts B(X) and B(Y) along the X- and Y-directions, respectively. Where there is no focus deviation, the amounts B(X) and B(Y) are identical. Where there is a focus deviation, they are different, and the midpoint B(J) between the amount of excitation B(X) of the stigmator coil at which the X-direction astigmatism evaluation amount assumes a peak value and the amount of excitation B(Y) of the stigmator coil at which the Y-direction astigmatism evaluation amount assumes a peak value is taken as the most appropriate amount of excitation of the stigmator coil.

The masks Mx and My are not always required to be found regarding each individual frame of image. If the first image obtained at the beginning of the automatic astigmatism correction has a relatively small amount of astigmatism, one set of masks Mx and My may be created from the image. The same masks may be applied to all images. Alternatively, n sets of masks may be created from all the images. N curves may be found by plotting the astigmatism evaluation value against the stigmator coil excitation amount. The effects of the masking can be maximized by finding the optimum amount of excitation of the stigmator coil from the curve having the steepest peak.

Furthermore, an image that has been fully corrected for focus and astigmatism can be obtained by performing the aforementioned automatic operation for focus correction once and the automatic operation for astigmatic correction once whenever one frame of image is obtained.

The corrective method described above is advantageous for a specimen having very strong vertical and horizontal features, such as a semiconductor interconnect pattern (i.e., having many combinations of linear shapes).

Where a semiconductor pattern is observed at a high magnification, the ratio of upper and lower flat base portions is high. In this case, the aforementioned corrective method is more advantageous.

With the prior art automatic method for focus correction, if the specimen has a pattern with high directionality, and if the direction in which the focus evaluation value is found is not coincident with the direction of the pattern, the curve obtained by plotting the focus evaluation value against the amount of excitation of the objective lens is milder. The optimum amount of focus correction cannot be found accurately. Furthermore, in the automatic astigmatic correction, if the direction along which the astigmatism evaluation value is found is not coincident with the direction of the pattern, the curve obtained by plotting the astigmatism evaluation value against the amount of excitation of the stigmator coil is milder. Consequently, the optimum amount of astigmatic correction cannot be found accurately.

The automatic corrections of focus and astigmatism according to the present invention are made as follows for the specimen as described above. Even in the case of this specimen, the electron beam is scanned over the specimen by the two stages of deflection coil assemblies 4 and 5. Secondary electrons e produced from the specimen 3 in response to the scanning are detected by the secondary electron detector 14. The output signal from the detector 14 is stored as two-dimensional image data into the image memory 16 in synchronism with the vertical and horizontal scanning signals. The image data is routed to the image processor 17, which in turn calculates the focus evaluation amount in the procedure described below.

First, the image processor 17 identifies the directionality of the pattern from the image data sent to the processor. Well-known techniques are available for the identification and so their description is omitted. Examples of the well-known available techniques include use of the Hough transform or the Radon transform.

Figure 9:
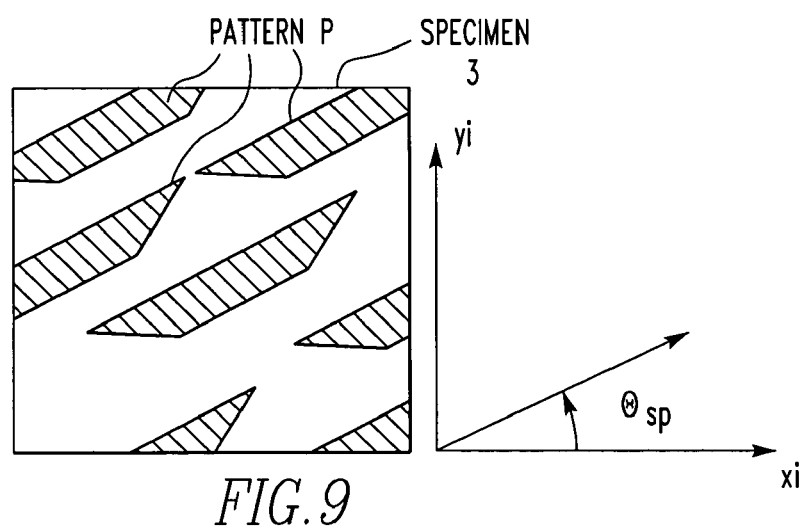
FIG. 9 is a diagram showing the directionality of a pattern formed on a surface of a specimen.

As a result of the identification of the directionality, a direction $\theta_{sp}$ along which the pattern P shows the most features with respect to the coordinate system $(x_i, y_i)$ of the image, as shown in FIG. 9, is found. At this time, the image is not always required to be optimally focused. It is only necessary that the image show a visible shape to some extent.

Then, the image processor 17 informs the control computer 18 of this direction $\theta_{sp}$. The computer 18 issues instructions to the vertical scanning signal generating circuit 6 and horizontal scanning signal generating circuit 8 according to the direction $\theta_{sp}$ to vary the ratio of mixture of their output signals, or scanning signals. In this way, the processor generates an instruction for rotating the scanning angle. Consequently, the scanning direction of the beam on the specimen 3 is rotated through $-\theta_{sp}$. As a result, image data indicating the direction of the highest pattern directionality coincident with the X-direction of the image is obtained.

Then, the amount of excitation of the objective lens 2 or auxiliary focusing coil 13 is varied in steps while maintaining the scanning angle at $-\theta_{sp}$. Image data is obtained at each amount of excitation.

Image data corresponding to each amount of the excitation and stored in the image memory 16 is routed frame by frame to the image processor 17. The processor 17 calculates the focus evaluation value for each of the X- and Y-directions on the viewing screen. This operation is performed along the computational flow similar to the calculation already described in connection with FIG. 5. That is, the edge components are extracted from the original image 51 using edge extraction filters. The original image is indicated by I1.

At this time, two filters each having an independent directionality are prepared by making use of the directionalities of one-dimensional filters. In this embodiment, one of the filters detects edge components parallel to the X-direction, while the other detects edge components parallel to the Y-direction. An X-direction edge component extraction operation 52 and a Y-direction edge component extraction operation 53 are performed independently. When each of the operations 52 and 53 is performed, noise reduction and normalization of numerical values are carried out to independently find a two-dimensional numerical matrix 54 indicating the X-direction edge components and a two-dimensional numerical matrix 55 indicating the Y-direction edge components. These matrices 54 and 55 are indicated by IX2 and IY2, respectively, in the figure.

The sum of the elements of each of the found matrices IX2 and IY2 is found. The sums are focus evaluation amounts 56 and 57 of the original image I1 in the X- and Y-directions, respectively.

The two-dimensional numerical matrices IX2 and IY2 are found for each image data about one frame of image obtained by varying the amount of excitation of the objective lens 2 or auxiliary focusing coil 13 in steps. Accordingly, the focus evaluation values in the X- and Y-directions, respectively, are calculated at each amount of the excitation.

In this way, the image processor 17 finds the focus evaluation values in the X- and Y-directions at each amount of the excitation. The found focus evaluation values are routed to the control computer 18.

The control computer 18 plots the focus evaluation values in the X- and Y-directions for each amount of the excitation as shown in FIG. 6. The computer 18 calculates the correlation between the amount of excitation of the objective lens 2 or auxiliary focusing coil 13 and the focus evaluation value of the image at each amount of the excitation, and takes them as the most appropriate amounts of lens excitations B(X) and B(Y) in the X- and Y-directions, respectively.

The most appropriate amounts of lens excitations B(X) and B(Y) are identical provided that there is no astigmatism. They differ where there is astigmatism. Where there is astigmatism, the midpoint B(J) between the amount of excitation B(X) of the lens at which the X-direction focus evaluation value assumes a peak value and the amount of excitation B(Y) of the lens at which the Y-direction focus evaluation amount assumes a peak value is taken as the most appropriate amount of excitation of the lens.

In the case of a specimen having only one directionality and producing a peak only along one axis, the peak may be taken as the focal point. Alternatively, it may be judged that error in operation has occurred, and the processing may be ended. The former operation is used in the case where there is no possibility of astigmatic deviation. The latter operation is used where the possibility of astigmatic deviation is high. The choice is assigned to the designer or observer.

In the description provided so far, X- and Y-directions set on the viewing screen have been taken as examples of directions. If the X- and Y-directions are set to the direction of the greatest directionality of the pattern and to an arbitrary direction independent of the former direction, respectively, it follows that focal positions in two independent directions are simultaneously found from one image.

As described thus far, in the above embodiment, the optimum amount of excitation of the objective lens can be found accurately regardless of the directionality of the pattern formed on the specimen.

The same results can be obtained by performing calculations on image data to rotate the image through $-\theta_{sp}$ within the image processor 17, instead of rotating the scanning angle of the electron beam through $-\theta_{sp}$.

Furthermore, the same results can be obtained by rotating the specimen stage (not shown) on which the specimen 3 is placed through $-\theta_{sp}$, instead of rotating the scanning angle of the electron beam through $-\theta_{sp}$.

The automatic operation for astigmatic correction is next described. The automatic astigmatic correction is made similarly to the aforementioned automatic operation for focus correction except that the controlled coil is replaced by the stigmator coil 20. However, the action of the magnetic field produced by the stigmator coil 20 on the electron beam has directionality. Therefore, it is necessary to correct the direction. The method of correction is described with reference to FIGS. 10 and 11.

In the embodiment of FIG. 4, the stigmator is a magnetic corrector using coils. An electrostatic stigmator using electrodes may also be used. Either type of stigmator generally produces a correcting field with eight-fold symmetry by coils or electrodes with eight poles.

When this is controlled, two corrective quadrupole fields shifted by 45° are controlled for convenience. Correctors for forming these corrective fields are referred to as stigmators A and B, respectively. The stigmators A and B diverge the beam in a certain direction θb and converge the beam in a direction θf at an angle of 90° to the direction θb.

FIGS. 10(a), 10(b), and 10(c) show the action of the stigmator A. FIG. 10(a) shows the action of the stigmator on a charged particle beam. FIG. 10(b) shows the action of the stigmator on the obtained image. FIG. 10(c) shows the relation between an image coordinate system (xi, yi) and the direction (xa, ya) of the action of the stigmator.

FIGS. 11(a), 11(b), and 11(c) show the action of the stigmator B. FIG. 11(a) shows the action of the stigmator on a charged particle beam. FIG. 11(b) shows the action of the stigmator on the obtained image. FIG. 11(c) shows the relation between an image coordinate system (xi, yi) and the direction (xa, ya) of the action of the stigmator.

The direction of action of the stigmator relative to the coordinate system (xi, yi) of the obtained image is uniquely determined by the relation between the angle at which the stigmator is mounted and the angle of the scanning coil and by the Larmor rotation of the magnetic lens (e.g., objective lens) present closer to the specimen than the stigmator. However, the direction is fundamentally not coincident with any axis of the coordinate system (xi, yi) of the image. Accordingly, it is necessary to grasp the relation between the coordinate system (xi, yi) of the image and the direction of action of the stigmator in advance.

Under some usage conditions, including accelerating voltage and emission current, the angle $\theta_{sa}$ made between the coordinate system (xa, ya) within which the stigmator A acts and the coordinate system (xi, yi) of the image is found computationally or experimentally. A list of different sets of usage conditions and the found values of the angle is created. Furthermore, the angle $\theta_{sb}$ made between the coordinate system (xb, yb) within which the stigmator B acts and the coordinate system (xi, yi) of the image is found computationally or experimentally. A list of different sets of usage conditions and the found values of the angle is created.

Of course, the difference between the angles $\theta_{sa}$ and $\theta_{sb}$ is +45° or −45°. The lists are used as system parameters and automatically read into the control computer 18 during the automatic astigmatic correction. Where the angles are found experimentally, a specimen consisting of particles made as fine as possible and having a uniform direction should be prepared. If this specimen is observed, the direction of action can be easily found by using the aforementioned method of identifying the directionality.

An automatic stigmatic correction is performed using the stigmators A and B independently. As an example, an automatic stigmatic correction using the stigmator A is described.

First, the direction of action $\theta_{sa}$ of the stigmator A is entered into the control computer 18. The computer 18 issues instructions to the vertical scanning signal generating circuit 6 and horizontal scanning signal generating circuit 8 to vary the ratio of mixture of their output signals, or scanning signals. In this way, the processor generates an instruction for rotating the scanning angle. Consequently, the scanning direction of the beam on the specimen 3 is rotated through $-\theta_{sp}$. As a result, image data indicating the direction of the greatest pattern directionality coincident with the X-direction on the image is obtained.

Then, the amount of excitation of the stigmator A is varied in steps while maintaining the scanning angle at $-\theta_{sa}$. Image data is obtained at each value of the excitation. Image data corresponding to each value of the excitation and stored in the image memory 16 is routed frame by frame to the image processor 17.

In the subsequent processing, the most appropriate amount of lens excitation is found by a method similar to the aforementioned automatic method of focus correction about each of the directions of action Xa and Ya of the stigmator. These appropriate amounts are indicated by B(x) and B(Y), respectively.

Where there is no focus deviation, the amounts B(X) and B(Y) are identical in principle. Where there is a focus deviation, the amounts are different from each other. Where there is a focus deviation, the most appropriate amount of excitation of the stigmator A is the midpoint B(J) between the amount of excitation B(X) of the stigmator A at which the astigmatism evaluation value in the X-direction assumes a peak and the amount of excitation B(Y) of the stigmator A at which the astigmatism evaluation value in the Y-direction assumes a peak.

In the case of a specimen having only one directionality and producing a peak only in one direction, this single peak is set as the most appropriate amount of excitation of the stigmator A. Alternatively, it may be judged that error in operation has occurred, and the processing may be ended. The former operation is used in the case where there is no possibility of focus deviation. The latter operation is used where the possibility of focus deviation is high. Generally, however, the focus varies greatly depending on the height of the observed specimen and so designers and observes will adopt the latter operation.

The optimum amount of excitation B(J) of the stigmator B is found by performing the same procedure as the automatic astigmatic correction using the stigmator A except that the rotational angle of the scanning direction of the beam is changed to $-\theta_{sp}$.

Where the pattern formed on the specimen 3 has strong directionality, the directionality of the image is varied by rotation of the scanning angle. Therefore, the steepness of the curve of the astigmatism evaluation amount decreases, deteriorating the accuracy of the automatic astigmatic correction. In this case, the direction $\theta_{sp}$ of the specimen is fed back to the motor that rotates the specimen stage to bring the direction of the specimen into coincidence with the direction of action $\theta_{sa}$ of the stigmator. This permits most accurate astigmatic correction.

Where the specimen has a pattern consisting of elements spaced apart from each other in one direction (e.g., a line and space pattern), the motor for rotating the specimen stage is rotated through 90°. The astigmatism evaluation amount is measured before and after the motor is driven (i.e., the measurement is performed twice). In this way, the astigmatism evaluation values in the X- and Y-directions, respectively, can be found separately.

If a technique for driving the motor that rotates the specimen stage is used, the automatic astigmatic correction is made accurately where a specimen having strong directionality is used.

Where this technique is also used in the automatic focus correction, this correction is made accurately where there is astigmatism.

It is to be understood that the present invention is not limited to the above embodiments but rather various changes and modifications are possible. For example, the automatic corrections of focus and astigmatism according to the present invention can also be used for scanning charged-particle beam instruments other than scanning electron microscopes.

Furthermore, where the automatic operation for focus correction is performed, the operator can arbitrarily select whether the objective lens or auxiliary focusing coil is used. Where the auxiliary focusing coil is used, a coreless coil is used and, therefore, it is possible to vary the state of focus in steps quickly. Where the optimum focal position is measured using the auxiliary focusing coil, an electrical current corresponding to the optimum focal position may be passed through the auxiliary focusing coil or through the objective lens. After the end of the automatic operation of focus correction, it is possible not to use the auxiliary focusing coil.

Note that in a scanning charged-particle beam instrument using an ion beam, the magnetic field produced by the auxiliary focusing coil is weak. Therefore, the auxiliary focusing coil cannot be used. Accordingly, in this kind of instrument, an electrostatic objective lens is usually used.

In the present invention, the upper and lower foci are separately detected, and the focus is brought to their midpoint. Therefore, even where there is astigmatism, the automatic focus correcting function can be normally operated. Furthermore, even where there is a focus deviation, the automatic astigmatism correcting function can be operated normally. Moreover, astigmatism can be detected accurately because the upper and lower foci are detected separately. It is possible to judge whether there is astigmatism.

If an algorithm that detects the upper and lower foci separately is used regarding a pattern in one direction formed on a specimen surface, only one of the upper and lower foci can be detected. Accordingly, it has been recognized that astigmatic correction cannot be made regarding a pattern in one direction, such as a line and space pattern.

In the present invention, image data is processed such that the upper and lower foci are detected separately and so if the peaks of the curves from which the upper and lower foci are respectively found are different in height, the upper and lower foci can be detected separately. Therefore, the automatic astigmatism correcting function can be used almost independent of the features of the specimen. As a result, a specimen having directionality in at least two directions should be used to implement the automatic astigmatism correcting function. Hence, specimens can be selected from a wider range of choices.

In the present invention, two sets of data about an image taken along the X- and Y-directions, respectively, are processed independently. Consequently, the automatic corrections of focus and astigmatism can be made accurately concerning a specimen having high directionality in the X- and Y-directions, such as an LSI pattern.

In the present invention, when the automatic focus correction is made, the direction along which image processing is performed in finding a focus evaluation value is made coincident with the direction of pattern on the specimen. Furthermore, when the automatic astigmatic correction is made, the direction along which image processing is performed in finding an astigmatism evaluation value is made coincident with the direction of action of the stigmator. Moreover, when the automatic astigmatic correction is made, the direction along which image processing is performed in finding an astigmatism evaluation value is made coincident with the direction of action of the stigmator. Also, the direction of the pattern on the specimen is also brought into coincidence. Consequently, the focus evaluation value and astigmatism evaluation value can be measured at higher accuracy. The accuracy of the automatic corrections of focus and astigmatism can be improved greatly regarding a pattern that is flat and has a small amount of features but has strong directionality, such as an LSI pattern.

In the present invention, noise in an image having a pattern that is flat and has a small amount of features but has strong directionality, such as an LSI pattern, is effectively masked. Therefore, noise is reduced during the automatic corrections of focus and astigmatism. The focus and astigmatism evaluation values can be calculated efficiently. In consequence, the automatic operations of focus correction and astigmatic correction can be made efficiently where an LSI pattern is observed. In addition, where an LSI pattern is observed at high magnification, noise component contained in the image data can be reduced greatly. Hence, the automatic focus correction and astigmatic correction can be made with high accuracy.

Having thus described my invention with the detail and particularity required by the Patent Laws, what is desired protected by Letters Patent is set forth in the following claims.

The invention claimed is:

1. A method for automatically making a focus correction in a scanning charged-particle beam instrument that focuses a beam of charged particles onto a specimen, scans a desired area on the specimen in two dimensions with the beam, detects a signal obtained by the scanning, and displays an image of the specimen according to the detected signal, said method comprising the steps of:

varying the strength of a lens, which focuses the beam onto the specimen, in steps such that the state of the focus of the beam on the specimen is varied in steps;

scanning the desired area on the specimen with the beam in each step of the focus;

obtaining image data from the signal detected and obtained by the scanning with the beam;

processing the image data to find a focus evaluation value;

finding a focal position from a relation between the strength of the lens and the focus evaluation value; and setting the strength of the lens that focuses the beam to a value corresponding to the focal position, such that when the image data is processed to find the focus evaluation value, image data about one frame of image is processed in each of arbitrary first and second directions that are independent of each other, such that the strength of the lens is found at each of two focal positions in the first and second directions, respectively, according to the focus evaluation value found in each step of the focus, and such that the strength of the lens, which focuses the beam, is set, using the midpoint between the two focal positions as an overall focal position.

2. A method for automatically making a focus correction in a scanning charged-particle beam instrument as set forth in claim 1, further comprising the steps of:

extracting edge components from one frame of image in each of arbitrary first and second directions using one-dimensional edge extraction filters;

finding a first two-dimensional matrix of numerical values indicating the edge components in the first direction and a second two-dimensional matrix of numerical values indicating the edge components in the second direction;

finding sums or average values of the numerical values of the matrices, respectively; and taking the sums or average values as focus evaluation values in the two directions, respectively.

3. A method for automatically making a focus correction in a scanning charged-particle beam instrument as set forth in any one of claims 1 and 2, wherein when no focal position is obtained in any one of the first and second directions due to surface topography of the specimen, the strength of the lens that focuses the beam is set according to a focal position obtained in the other direction.

4. A method for automatically making a focus correction in a scanning charged-particle beam instrument as set forth in any one of claims 1 and 2, wherein when no focal position is obtained in any one of the first and second directions due to surface topography of the specimen, a message indicating error in operation is displayed on a display device or a warning is issued.

5. A method for automatically making a focus correction in a scanning charged-particle beam instrument as set forth in any one of claims 1 and 2, wherein the strength of an objective lens is varied such that the state of the focus of the beam focused onto the specimen is varied in steps.

6. A method for automatically making a focus correction in a scanning charged-particle beam instrument as set forth in any one of claims 1 and 2, wherein the strength of an auxiliary focusing lens disposed close to an objective lens is varied such that the state of the focus of the beam focused onto the specimen is varied in steps.

7. A method for automatically making a focus correction in a scanning charged-particle beam instrument as set forth in any one of claims 1 and 2, wherein when a desired area on the specimen is scanned with the beam in two dimensions, image data is obtained while bringing at least one of the directions of the two-dimensional scanning into coincidence with a direction along which a pattern formed on a surface of the specimen has many features, and wherein focal positions in the first and second directions are found according to the image data.

8. A method for automatically making a focus correction in a scanning charged-particle beam instrument as set forth in any one of claims 1 and 2, wherein
   (A) when a desired area on the specimen is scanned with the beam in two dimensions, at least one of the directions of the two-dimensional scanning is brought into coincidence with a direction along which a pattern formed on a surface of the specimen to be observed has many features and then the specimen is rotated relative to the directions of the two-dimensional scanning with the beam,
   (B) two sets of image data are obtained, respectively, before and after the specimen is rotated, and
   (C) the focus evaluation value is found according to the obtained two sets of image data.

9. A method for automatically making a focus correction in a scanning charged-particle beam instrument as set forth in claim 7, wherein when a desired area on the specimen is scanned with the beam in two dimensions, a specimen stage on which the specimen is placed is rotated to bring at least one of the directions of the two-dimensional scanning into coincidence with a direction along which a pattern formed on a surface of the specimen has many features.

10. A method for automatically making a focus correction in a scanning charged-particle beam instrument as set forth in claim 7, wherein when a desired area on the specimen is scanned with the beam in two dimensions, the scanning direction of the beam directed at the specimen is rotated to bring at least one of the directions of the two-dimensional scanning into coincidence with a direction along which a pattern formed on a surface of the specimen has many features.

11. A method for automatically making a focus correction in a scanning charged-particle beam instrument as set forth in any one of claims 1 and 2, wherein where said specimen to be observed does not permit detection of astigmatism in a charged-particle beam optical system, it is possible to select whether the automatic focus correction is interrupted or not.

12. A method for automatically making a focus correction in a scanning charged-particle beam instrument as set forth in any one of claims 1 and 2, wherein when said image data is processed to find the focus evaluation amount, the image is divided into plural regions and the focus evaluation amount is found for each of the regions, and wherein when the focus evaluation amount of the image is found, regions of lower focus evaluation amounts are excluded.

13. A method for automatically making an astigmatic correction in a scanning charged-particle beam instrument by focusing a beam of charged particles onto a specimen, scanning a desired area on the specimen in two dimensions with the beam, detecting a signal obtained by the scanning, and displaying an image of the specimen according to the detected signal, said method comprising the steps of:

varying the strength of a stigmator in steps;

scanning a certain area on the specimen with the beam at each value of the strength of the stigmator;

obtaining image data from the signal detected and obtained based on the scanning with the beam;

processing the image data to find an astigmatism evaluation value;

finding an optimum position for astigmatic correction from a relation between the strength of the stigmator and the astigmatism evaluation value; and setting the strength of the stigmator to a value corresponding to the optimum position for astigmatic correction, wherein when the image data is processed to find the astigmatism evaluation value, data about one frame of image is processed in each of arbitrary first and second directions that are independent of each other, wherein strengths of the stigmator that give optimum positions for astigmatic correction in the first and second directions, respectively, are found according to the astigmatism evaluation value found at each value of the strength of the stigmator, and wherein the strength of the stigmator is set, using the midpoint of the two optimum positions as an optimum position for astigmatic correction.

14. A method for automatically making an astigmatic correction in a scanning charged-particle beam instrument as set forth in claim 13, further comprising the steps of:

extracting edge components from each frame of image in each of arbitrary first and second directions using one-dimensional edge extraction filters;

finding a first two-dimensional matrix of numerical values indicating the edge components in the first direction and a second two-dimensional matrix of numerical values indicating the edge components in the second direction;

finding sums or average values of the numerical values of the matrices, respectively; and taking the sums or average values as astigmatism evaluation values in the respective directions.

15. A method for automatically making an astigmatic correction in a scanning charged-particle beam instrument as set forth in any one of claims 13 and 14, wherein when any optimum astigmatic correction position is not obtained in any one of the first and second directions due to surface topography of the specimen, the strength of the stigmator is set according to an optimum astigmatic correction position obtained in the other direction.

16. A method for automatically making an astigmatic correction in a scanning charged-particle beam instrument as set forth in any one of claims 13 and 14, wherein when any optimum astigmatic correction position is not obtained in any one of the first and second directions due to surface topography of the specimen, a message indicating error in operation is displayed on a display device or a warning is issued.

17. A method for automatically making an astigmatic correction in a scanning charged-particle beam instrument as set forth in any one of claims 13 and 14, wherein when a desired area on the specimen is scanned with the beam in two dimensions, image data is obtained while bringing at least one of the directions of the two-dimensional scanning into coincidence with a direction along which a pattern formed on a surface of the specimen has many features, and wherein astigmatism evaluation values and optimum astigmatic correction positions in the first and second directions are found according to the image data.

18. A method for automatically making an astigmatic correction in a scanning charged-particle beam instrument as set forth in any one of claims 13 and 14, wherein (A) when a desired area on the specimen is scanned with the beam in two dimensions, at least one of the directions of the two-dimensional scanning is brought into coincidence with a direction along which a pattern formed on a surface of the specimen has many features and then the specimen is rotated relative to the directions of the two-dimensional scanning with the beam, (B) two sets of image data are obtained, respectively, before and after the specimen is rotated, and (C) the astigmatism evaluation values and optimum astigmatic correction positions are found according to the obtained two sets of image data.

19. A method for automatically making an astigmatic correction in a scanning charged-particle beam instrument as set forth in any one of claims 13 and 14, wherein a specimen stage on which the specimen is placed is rotated when a desired area on the specimen is scanned with the beam in two dimensions to bring at least one of the directions of the two-dimensional scanning into coincidence with a direction along which a pattern formed on a surface of the specimen has many features.

20. A method for automatically making an astigmatic correction in a scanning charged-particle beam instrument as set forth in any one of claims 13 and 14, wherein when a desired area on the specimen is scanned with the beam in two dimensions, the scanning direction of the beam directed at the specimen is rotated to bring at least one of the directions of the two-dimensional scanning into coincidence with a direction along which a pattern formed on a surface of the specimen has many features.

21. A method for automatically making an astigmatic correction in a scanning charged-particle beam instrument as set forth in claim 13, wherein where said specimen to be observed does not permit detection of astigmatism in a charged-particle beam optical system, it is possible to select whether the automatic astigmatic correction is interrupted or not.

22. A method for automatically making an astigmatic correction in a scanning charged-particle beam instrument as set forth in claim 13, wherein when said image data is processed to find the astigmatism evaluation value, the image is divided into plural regions and the astigmatism evaluation value is found for each of the regions, and wherein when the astigmatism evaluation value of the image is found, regions of lower astigmatism evaluation values are excluded.

23. A method of automatically correcting focus and astigmatism in a scanning charged-particle beam instrument for focusing a beam of charged particles onto a specimen, scanning a desired area on the specimen with the beam in two dimensions, detecting a signal produced as a result of the scanning, and displaying an image of the specimen according to the detected signal, said method comprising the steps of:

varying the strength of a lens, which focuses the charged-particle beam onto the specimen, in steps such that the state of the focus of the beam on the specimen is varied in steps;

scanning the desired area on the specimen with the beam in each step of the focus;

obtaining image data from a signal detected and obtained based on the scanning with the beam;

processing the image data to find a focus evaluation value;

finding a focal position from a relation between the strength of the lens and the focus evaluation value;

setting the strength of the lens that focuses the beam to a value corresponding to the focal position;

varying the strength of a stigmator in steps;
scanning the desired area on the specimen with the beam at each strength of the stigmator;
obtaining image data from the signal detected and obtained based on the scanning with the beam;
processing the image data to find an astigmatism evaluation value;
finding an optimum astigmatic correction position from a relation between the strength of the stigmator and the astigmatism evaluation value; and
setting the strength of the stigmator corresponding to the optimum astigmatic correction position, wherein
(A) when said image data is processed to find the focus evaluation value, image data about one frame of image is processed in each of arbitrary first and second directions that are independent of each other, lens strengths providing focal positions in the first and second positions, respectively, are found according to the focus evaluation value found in each step of the focus, and the strength of the lens focusing the beam is set using the midpoint of the focal positions as an overall focal position, whereby performing an automatic operation for focus correction,
(B) when said image data is processed to find the astigmatism evaluation value, image data about one frame of image is processed in each of arbitrary first and second directions that are independent of each other, stigmator strengths providing optimum astigmatic correction positions in the first and second positions, respectively, are found according to the astigmatism evaluation value found at each strength of the stigmator, and the strength of the stigmator is set using the midpoint of the optimum astigmatic correction positions as an overall optimum stigmatic correction position, whereby performing an automatic operation for astigmatic correction, and
(C) each of said automatic operation for focus correction and said automatic operation for astigmatic correction is performed at least once, whereby the focus and astigmatism are corrected at the same time.

* * * * *